United States Patent [19]

Abe

[11] Patent Number: 5,343,060
[45] Date of Patent: Aug. 30, 1994

[54] APPARATUS FOR REDUCING MIRROR IN A SOLID STATE IMAGING DEVICE WHEREIN A LIGHT INTERCEPTING LAYER SHIELDS A TRANSFER MEANS FROM INSTANT LIGHT AND HAS AN EDGE WHICH SLOPES TOWARD THE LIGHT SENSING REGION

[75] Inventor: Hideshi Abe, Kanagawa, Japan

[73] Assignee: Sony Corporation, Tokyo, Japan

[21] Appl. No.: 6,936

[22] Filed: Jan. 21, 1993

[30] Foreign Application Priority Data

Jan. 23, 1992 [JP] Japan .................... 4-010074

[51] Int. Cl.$^5$ .............. H01L 29/78; H01L 27/14; G11C 19/28
[52] U.S. Cl. ..................... 257/229; 257/230; 257/435; 257/445; 377/63
[58] Field of Search .............. 257/229, 230, 435, 214, 257/215, 225, 233, 436, 445; 377/57-63

[56] References Cited

U.S. PATENT DOCUMENTS

| | | | |
|---|---|---|---|
| 4,696,021 | 9/1987 | Kawahara et al. | 257/229 |
| 4,914,493 | 4/1990 | Shiromizu | 257/229 |

FOREIGN PATENT DOCUMENTS

| | | | |
|---|---|---|---|
| 58-138187 | 8/1983 | Japan | 257/229 |
| 63-44760 | 2/1988 | Japan | 257/435 |
| 63-44761 | 2/1988 | Japan | 257/435 |
| 03242974 | 10/1991 | Japan | 257/229 |

Primary Examiner—Rolf Hille
Assistant Examiner—Mahshid Saadat
Attorney, Agent, or Firm—Hill, Steadman & Simpson

[57] ABSTRACT

The present invention is directed to a solid state imaging deice in which a light sensing region (3), a vertical register (4) and a channel stopper region (5) are formed within a well region (2) on an N-type silicon substrate (1). A positive electric charge storage region (6) is formed on the surface of the light sensing region (3) and a well region (7) is formed beneath the vertical register (4), respectively. Further, a transfer electrode (9) is selectively formed on the vertical register (4) through a gate insulating layer (8) and an Al light-intercepting layer (11) is formed on the transfer electrode (9) through an interlevel insulator (10). A surface protecting layer (12) is formed on the whole surface including the Al light-intercepting layer (11). In this solid state imaging device, a tapered portion (11a) is formed on the Al light-intercepting layer 11 corresponding to a peripheral edge portion of the light sensing region 3. An oblique light component in an incident light and a reflected light component are suppressed from being introduced into the vertical register (4) to thereby reduce a smear.

5 Claims, 4 Drawing Sheets

APPARATUS FOR REDUCING MIRROR IN A SOLID STATE IMAGING DEVICE WHEREIN A LIGHT INTERCEPTING LAYER SHIELDS A TRANSFER MEANS FROM INSTANT LIGHT AND HAS AN EDGE WHICH SLOPES TOWARD THE LIGHT SENSING REGION

BACKGROUND OF THE INVENTION

1. Field of the Invention:

The present invention relates to a solid state imaging device which can reduce smear and a manufacturing method thereof.

2. Description of the Prior Art:

As CCD (charge coupled device) solid state imaging device for use in CCD cameras or the like, there are generally known a CCD solid state imaging device (horizontal overflow CCD) which discharges saturated electrical charges in the horizontal direction and a CCD solid state imaging device (vertical overflow CCD) which discharges saturated electrical charge in the substrate direction, i.e., vertical direction.

The former CCD, i.e., the horizontal overflow CCD has a problem that electrical charges, photoelectrically-converted in the region except a depletion layer in the light sensing area enter a vertical register to cause a false signal (smear). Whereas, in the latter CCD, i.e., the vertical overflow CCD, electrical charges, photoelectrically-converted, in the region except the depletion layer of the light sensing area can be discharged toward the substrate side and therefore generates less smear as compared with the horizontal overflow CCD.

FIG. 1 of the accompanying drawings shows a structure of a solid state imaging device based on the conventional vertical overflow CCD. As shown in FIG. 1, an N-type light sensing region 3, a vertical register 4 and a P-type channel stopper region 5 are formed within a first P-type well region 2 on an N-type silicon substrate 1. A P-type positive electrical charge storage region 6 is formed on the surface of the light sensing region 3 and a second P-type well region 7 is formed beneath the vertical register 4, respectively. A transfer electrode 9 formed of a polycrystalline silicon layer is selectively formed on the vertical register 4 through a gate insulating layer 8. An Al light-intercepting layer 11 is formed on the transfer electrode 9 through an interlevel insulator 10, and a surface protecting layer 12 formed of an plasma SiN layer, for example, is formed on the whole surface including the Al light-intercepting layer 11. A P-type region formed between the light sensing region 3 and the vertical register 4 forms a read-out gate 13.

The Al light-intercepting layer 11 is selectively removed on the light sensing region 3 by the etching process and a light L is introduced into the light sensing region 3 through a hole 14 formed by this etching process.

In the conventional CCD solid state imaging device, however, the Al light-intercepting layer 11 is selectively removed on the light sensing region 3 by the etching process after the Al light-intercepting layer 11 was formed on the interlevel insulator 10 so that a transparent film such as the gate insulating layer 8, the interlevel insulator 10 or the like is continuously formed from the lower portion of the hole 14 of the Al light-intercepting layer 11 up to the upper portion of the vertical register 4. As a result, of the light L that became incident on the light sensing region 3 side, a diffracted light thereof is introduced through the interlevel insulator 10 and the gate insulating layer 8 to the vertical register 4 side and a part of the light component thus introduced becomes incident on the vertical register 4 to thereby cause a smear to occur.

According to the prior art, in order to reduce the smear, it is proposed to reduce a thickness of the interlevel insulator 10 formed between the Al light-intercepting layer 11 and the light sensing region 3. There is already a limit that the smear is reduced by forming the interlevel insulator 10 as a thin film.

Further, an amount in which a smear occurs after the surface protecting layer 12 was formed is increased about twice as compared with that of the case where the surface protecting layer 12 is not formed, resulting in the picture quality being deteriorated. The reason for this is that, as shown by a one-dot chain line frame D in FIG. 1, since the upper portion on the edge portion of the Al light-intercepting layer 11 which determines the hole 14 of the light sensing region 3 is formed as an acute angle portion, the shape of the surface protecting layer 12 formed thereon becomes a spherical shape having a small curvature and becomes a convex lens portion 12s.

More specifically, the light L incident from above is considerably refracted at the aforesaid convex lens portion 12s and therefore advanced toward the vertical register 4. As a result, in addition to an oblique light component $L_1$ that is obliquely introduced into the vertical register 4, a reflected light component $L_2$ introduced into the vertical register 4 while being reflected between the silicon surface and the under surface of the Al light-intercepting layer 11 is increased, which as a result causes a smear to occur frequently.

The cause that the shape of the surface protecting layer 12 at its portion formed on the peripheral edge of the light sensing region 3 becomes the convex lens (12s) is that, as earlier noted, the coverage of the surface protecting layer 12 is deteriorated because the edge shape of the Al light-intercepting layer 11 is the acute angle. However, since the hole 14 on the light sensing region 3 must be formed with high accuracy and stability, the Al light-intercepting layer 11 must be subjected to the patterning by the anisotropic-etching such as the RIE (reactive ion etching) or the like. There is then the disadvantage such that the edge shape of the Al light-intercepting layer 11 becomes acute unavoidably.

OBJECTS AND SUMMARY OF THE INVENTION

Therefore, it is an object of the present invention to provide an improved solid state imaging device in which the aforesaid shortcomings and disadvantages encountered with the prior art can be eliminated.

More specifically, it is an object of the present invention to provide a solid state imaging device which can reduce a smear.

It is another object of the present invention to provide a method of manufacturing a solid state imaging device in which a smear can be reduced.

According to a first aspect of the present invention, there is provided a solid state imaging device in which, even when the light incident from above is introduced into the edge portion of the light sensing region, i.e., the surface protecting layer formed as the convex lens shape, the light is refracted by a small amount because the curvature of that portion becomes large. Consequently, the light is not refracted very much and the oblique light component obliquely introduced into the vertical register and the reflected light component introduced into the vertical register while being reflected between the substrate and the light-intercepting layer are reduced. Hence, the occurrence of smear can be reduced.

According to a second aspect of the present invention, there is provided a solid state imaging device in which a light sensing region and a transfer register region are respectively arranged on the same substrate, a light-intercepting layer is formed on the transfer register and a surface protecting layer is formed on the whole surface including the light-intercepting layer. In the light-intercepting layer, a portion on the peripheral edge of the light sensing region is formed as a tapered portion.

Further, there is provided a manufacturing method of a solid state imaging device in which a light sensing region and a transfer register are respectively arranged on the same substrate, a light-intercepting layer is formed on a transfer electrode above the transfer register and a surface protecting layer is formed on the whole surface including the light-solid intercepting layer. In this manufacturing method, after the light-intercepting layer was formed on the whole surface including the transfer electrode through an interlevel insulator, the light-intercepting layer on the light sensing region is partly etched away by an isotropic-etching process with a photoresist layer having a hole formed at its portion corresponding to the light sensing region as a mask. Then, after a light sensing portion hole was formed by etching away the light-intercepting layer with the photoresist layer as a mask in the isotropic-etching, the surface protecting layer is formed on the whole surface.

The above and other objects, features, and advantages of the present invention will become apparent from the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

Embodiments of the present invention will hereinafter be described with reference to the drawings.

Figure 1:
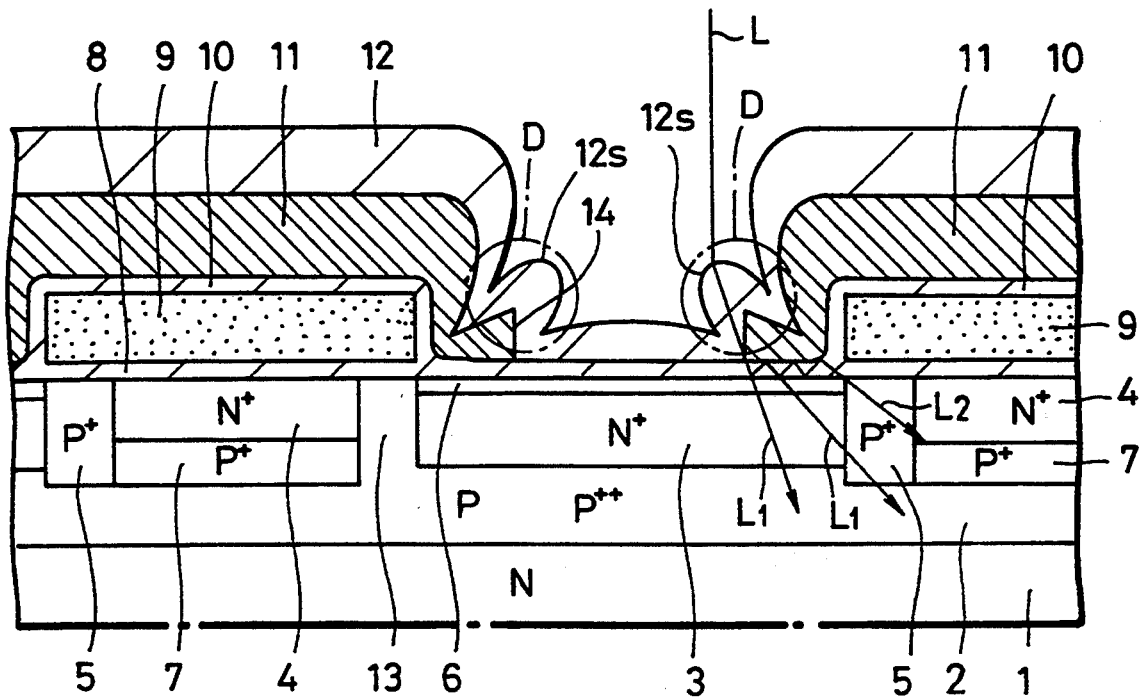
FIG. 1 is a diagram showing a structure of a main portion of a CCD solid state imaging device according to an example of the prior art.
Figure 2:
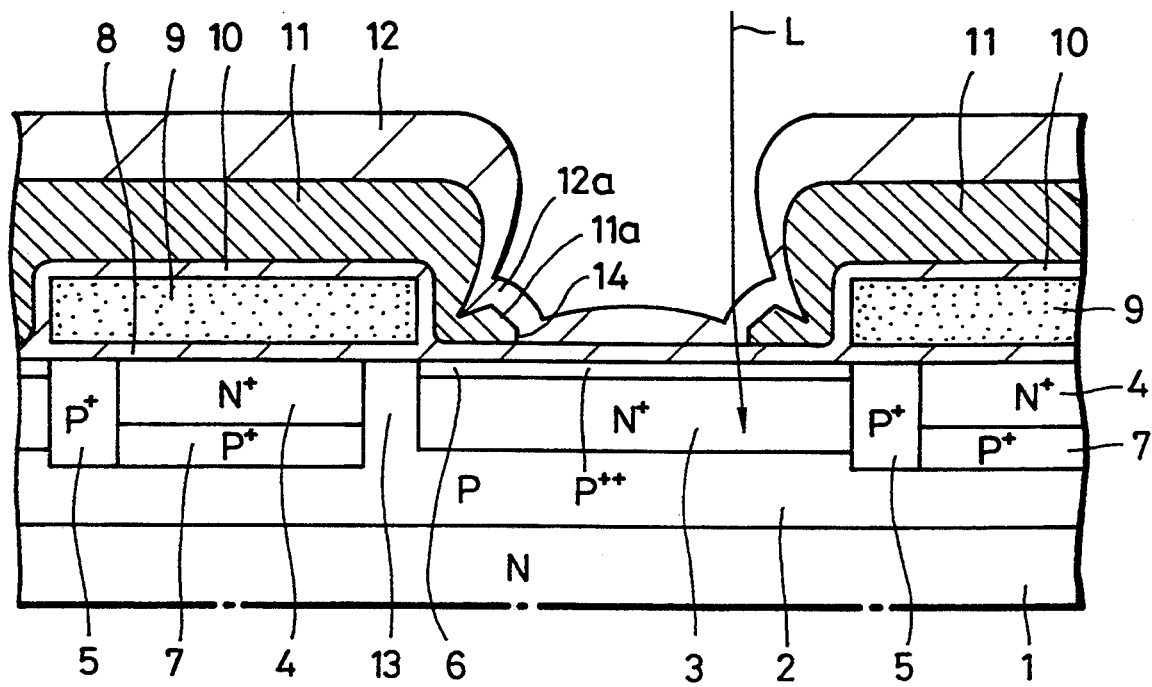
FIG. 2 is a diagram showing a structure of a main portion of a CCD solid state imaging device according to an embodiment of the present invention.

FIG. 2 of the accompanying drawings shows a structure of a main portion of a CCD solid state imaging device according to an embodiment of the present invention. In FIG. 2, like parts corresponding to those of FIG. 1 are marked with the same references numerals.

As shown in FIG. 2, in this CCD solid state imaging device, the N-type light sensing region 3, the N-type vertical register 4 and the P-type channel stopper region 5 are formed within the first P-type well region 2 on the N-type silicon substrate 1. The P-type positive electrical charge storage region 6 is formed on the surface of the light sensing region 3 and the second P-type well region 7 is formed beneath the vertical register 4.

The transfer electrode 9 made of the polycrystalline silicon layer is selectively formed on the vertical register 4 through the gate insulating layer 8. The Al light-intercepting layer 11 is formed on the transfer electrode 9 through the interlevel insulator 10, and the surface protecting layer 12 formed of the plasma SiN layer, for example, is formed on the whole surface including the Al light-intercepting layer 11, thereby constructing the CCD solid state imaging device. The P-type region formed between the light sensing region 3 and the vertical register 4 forms the read-out gate 13.

The Al light-intercepting layer 11 is selectively etched away on the light sensing region 3 and the light L is introduced into the light sensing region 3 through the hole 14 formed by the aforesaid etching process on the light sensing region 3. At that time, a part of the Al light-intercepting layer 11 is left on the peripheral edge of the light sensing region 3.

According to this embodiment, of the Al light-intercepting layer 11, the upper portion of the Al light-intercepting layer 11 on the peripheral edge of the light sensing region 3 is formed as a tapered portion 11a.

Figure 3A:
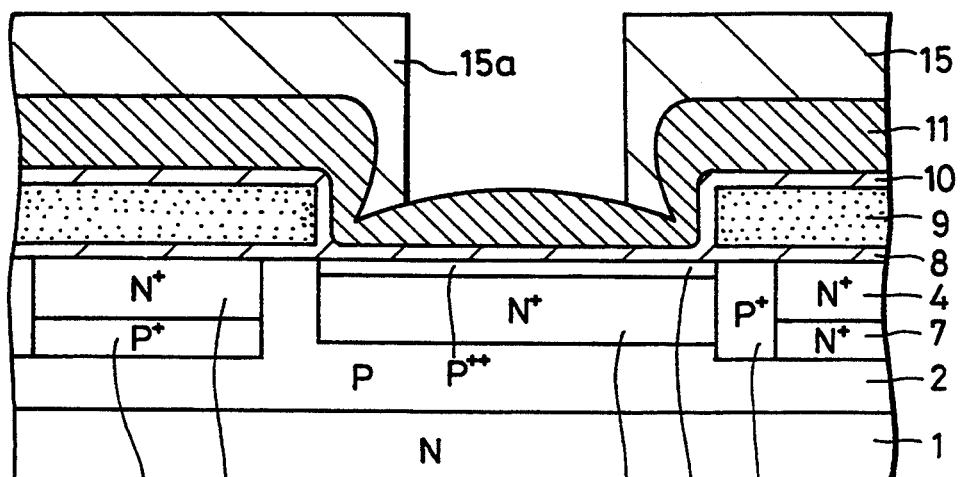
FIGS. 3A through 3C are respectively process diagrams showing a manufacturing method of the embodiment of the CCD solid state imaging device according to the present invention.
Figure 3B:
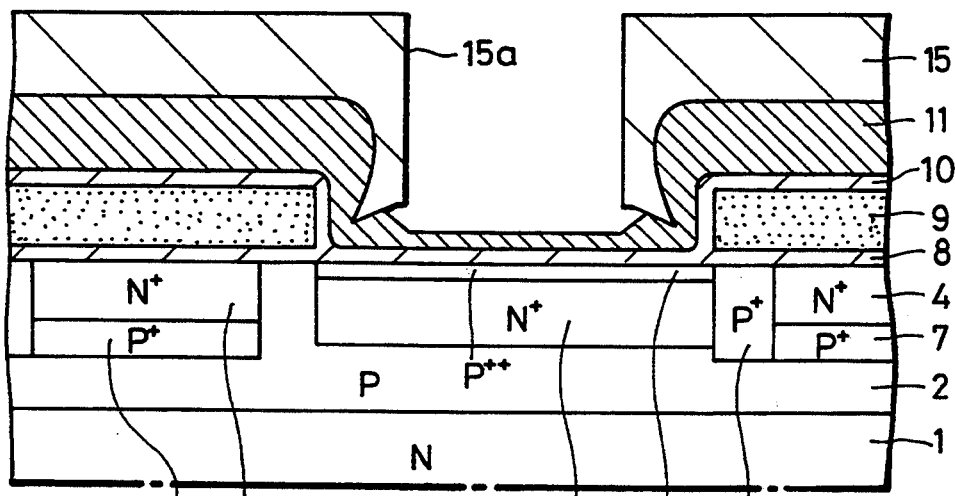
Figure 3C:
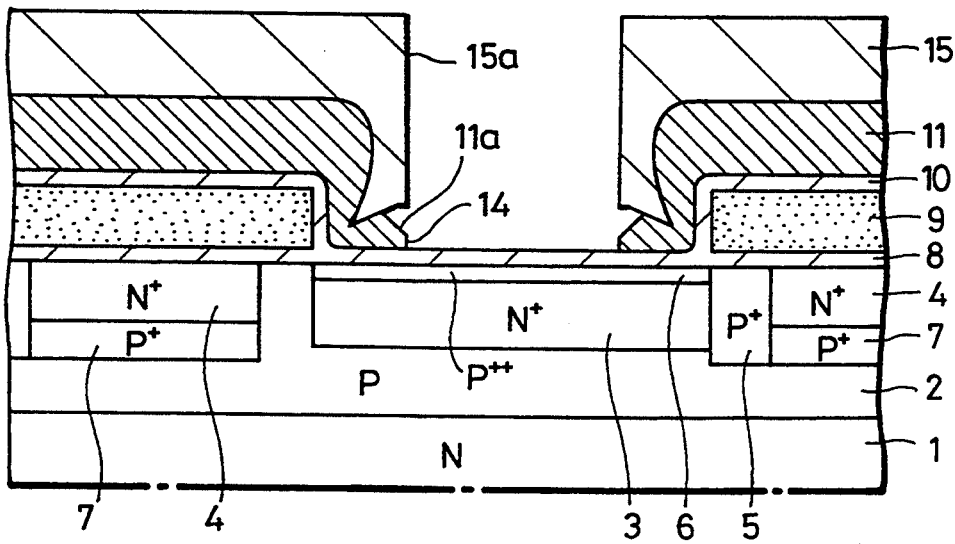

A manufacturing method of the CCD solid state imaging device according to the present invention will hereinafter be described with reference to FIGS. 3A through 3C. In FIGS. 3A to 3C of the accompanying drawings, like parts corresponding to those of FIG. 2 are marked with the same references.

As shown in FIG. 3A, by the implantation of necessary impurity and passivation using the ordinary CCD process, on the N-type silicon substrate 1, there are formed the first P-type well region 2, the N-type light sensing region 3, the vertical register 4, the P-type channel stopper region 5, the second P-type well region 7 and the P-type positive electrical charge storage region 6. Also, the transfer electrode 9 is formed on the vertical register 4 through the gate insulating layer 8.

Then, after the interlevel insulator 10 was formed on the whole surface including the transfer electrode 9, the Al light-intercepting layer 11 is formed on the whole surface. After a photoresist layer 15 was formed on the whole surface, a hole 15a is formed through the photoresist layer 15 at its portion corresponding to the light sensing region 3 by the exposure and development.

As shown in FIG. 3B, a phosphoric acid wet etching (isotropic etching) is carried out by using the photoresist layer 15 as a mask. A depth of etching is controlled by, for example, time or the like. By this isotropic etching, the side etching of the Al light-intercepting layer 11 is accomplished beneath the photoresist layer 15, in particular, over a range slightly wider than a width of the hole 15a.

Then, as shown in FIG. 3C, the photoresist layer 15 on the Al light-intercepting layer 11 is left as it is and the RIE (reactive ion etching) using a gas containing chlorine is carried out. At that time, the Al light-intercepting layer 11 exposed in the hole 15a of the photoresist layer 15 is cut vertically to form the hole (light sensing region hole 14) that reaches the light sensing region 3 optically. As the light sensing region hole 14 is formed, of the Al light-intercepting layer 11, the tapered portion 11a having a slope downwardly inclined toward the light sensing region 3 is formed on the peripheral edge portion of the light sensing region 3.

As shown in FIG. 2, after the aforesaid photoresist layer 15 was removed, the surface protecting layer 12 formed of the plasma SiN layer or $SiO_2$-system layer is formed, thereby the CCD solid state imaging device according to this embodiment being obtained. At that time, since the Al light-intercepting layer 11 on the peripheral edge of the light sensing region 3 is formed as the tapered portion 11a, the surface protecting layer 12 can be formed with a satisfactory coverage and the shape of the surface protecting layer 12 on the peripheral edge portion of the light sensing region 3 becomes a convex shape (convex lens shape 12a) having a large curvature.

Accordingly, the etching amount of the isotropic etching shown in FIG. 3B is determined taking the whole film thickness of the Al light-intercepting layer 11, the film thickness of the succeeding surface protecting layer 12 and the tapered portion 11a of the Al light-intercepting layer 11 on the peripheral edge of the light sensing region 3 into a consideration.

More specifically, the etching amount of the isotropic etching is determined such that the curvature of the convex lens shape (12a) of the surface protecting layer 12 on the peripheral edge of the light sensing region 3 is maximized. In the isotropic etching process according to this embodiment, when the thickness of the surface protecting layer 12 is 500 nm and the thickness of the Al light-intercepting layer 11 is 800 nm, for example, the Al light-intercepting layer 11 is etched away by a depth of about 200 nm from the surface thereof. Further, when the thickness of the surface protecting layer 12 is 500 nm and the thickness of the Al light-intercepting layer 11 is 200 nm, for example, the Al light-intercepting layer 11 is etched away to a depth of about 150 nm from the surface thereof.

A difference between the CCD solid state imaging device according to this embodiment and a CCD solid state imaging device (having the same structure as that of the example of the prior art shown in FIG. 1) according to a comparative example will be described from an action standpoint with reference to FIGS. 4A through 4C and FIGS. 5A through 5C of the accompanying drawings. In the CCD solid state imaging device according to this embodiment, further two embodiments, i.e., embodiments 1 and 2 will be illustrated. The embodiment i shows the case such that the etching amount by the isotropic etching is selected to be small regardless of the thickness of the Al light-intercepting layer 11 or the like. The embodiment 2 shows the case such that the etching amount of the isotropic etching is determined taking the thickness of the light-intercepting layer 11 or the like into consideration. Further, in FIGS. 4A through 4C and FIGS. 4A through 5C, only the light sensing region 3 and the vertical register 4 are illustrated with respect to the impurity diffusion region and the channel stopper region 5 or the like is not shown for simplicity.

The CCD solid state imaging device in which the thickness of the surface protecting layer 12 is 500 nm and the thickness of the Al light-intercepting layer 11 is 800 nm will be described with reference to FIGS. 4A through 4C.

Figure 4C:
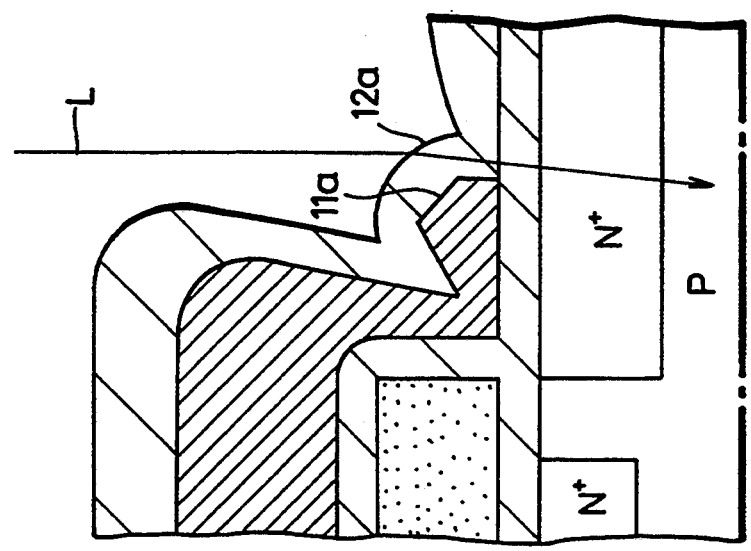
FIGS. 4A through 4C are respectively explanatory diagrams showing a difference among a comparative example and first and second embodiments of the present invention from an action standpoint.
Figure 4B:
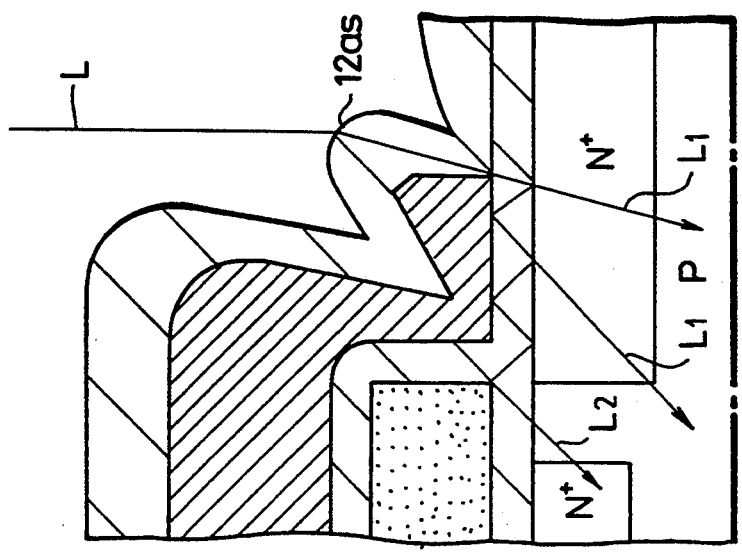
Figure 4A:
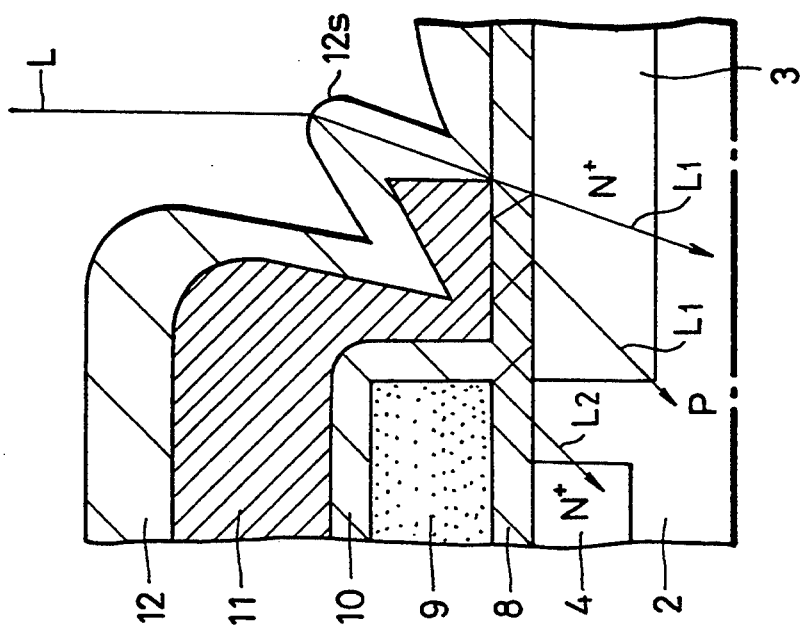

In the CCD solid state imaging device according to the comparative example, as shown in FIG. 4A, the Al light-intercepting layer 1 formed on the peripheral edge of the light sensing region 3 has an acute angle so that the shape of the surface protecting layer 12 formed above the Al light-intercepting layer 11 becomes a convex shape (convex lens-shape 12s) having a small curvature. Thus, the incident light L is considerably refracted at the aforesaid convex lens portion 12s of the surface protecting layer 12 and advanced toward the vertical register 4 side. Consequently, in addition to an oblique light component $L_1$ that becomes incident on the vertical register 4 in the oblique direction, the reflected light component $L_2$ that is reflected on the silicon surface and the Al light-intercepting layer 11 so as to be introduced into the vertical register 4 is increased. Therefore, a smear occurs frequently.

In the CCD solid state imaging device according to the embodiment 1, as shown in FIG. 4B, the Al light-intercepting layer 11 on the peripheral edge portion of the light sensing portion 3 is formed as a small tapered portion so that the shape of the surface protecting layer 12 formed on the Al light-intercepting layer 11 becomes a convex lens shape (12as) whose curvature is a little larger than that of the prior-art example. In that case, although the refractivity at which the incident light L is refracted at the convex lens portion 12as becomes a little smaller than that of the prior art example. The oblique light component $L_1$ and the reflected light component $L_2$ are increased depending on the incident position of the light L. As a result, a smear cannot be reduced.

According to the embodiment 2, as shown in FIG. 4C, taking the thickness of the Al light-intercepting layer 11 or the like into consideration, the Al light-intercepting layer 11 on the peripheral edge of the light sensing region 3 is formed to have the tapered portion 11a while considering the Al light-intercepting layer 11 so that the shape of the surface protecting layer 12 formed on the Al light-intercepting layer 11 is formed as the convex lens portion 12a whose curvature becomes larger than those of the prior-art example and the embodiment 1. Consequently, the incident light L is not substantially refracted on the above convex lens portion 12a. Hence, the light L becomes incident substantially vertically.

Consequently, the oblique light component $L_1$ toward the vertical register 4 is reduced. Also, since the light L becomes incident substantially vertically, the reflected light component $L_2$ that reaches the vertical register 4 while being reflected between the silicon surface and the under surface of the Al light-intercepting layer 11 is reflected substantially vertically and reflected in a multiple fashion, thereby being attenuated considerably. Accordingly, in the case of the embodiment 2, the oblique light component $L_1$ and the reflected light component $L_2$ are removed substantially. Therefore, the occurrence of smear that causes a problem in the CCD solid state imaging device can be reduced.

Figure 5C:
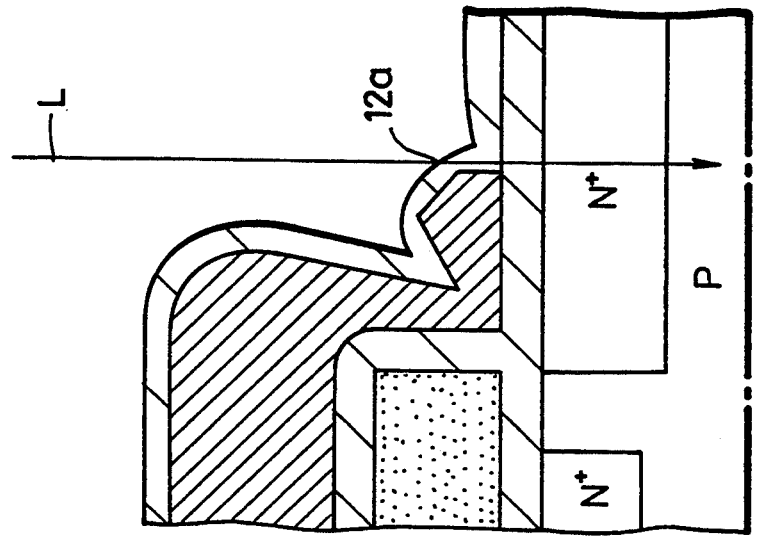
FIGS. 5A through 5C are respectively explanatory diagrams showing a difference among the comparative example and the first and second embodiments of the present invention from an action standpoint.
Figure 5B:
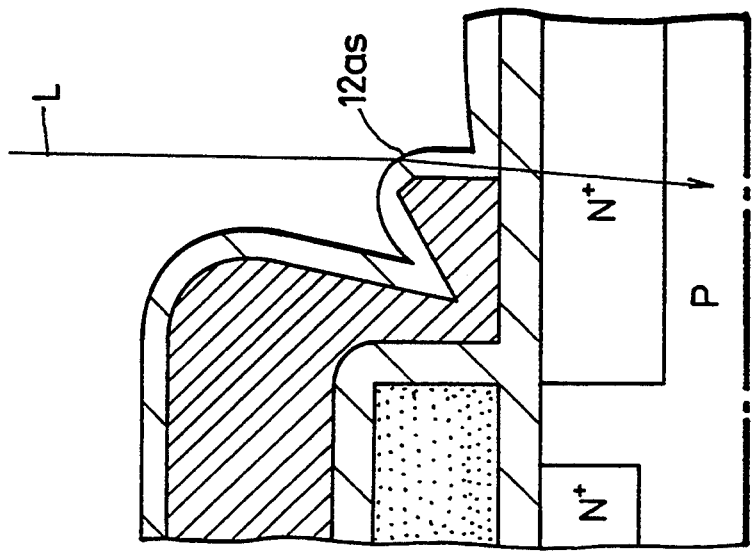

A CCD solid state imaging device in which the thickness of the surface protecting layer 12 is very thin will be described with reference to FIGS. 5A through 5C.

Figure 5A:
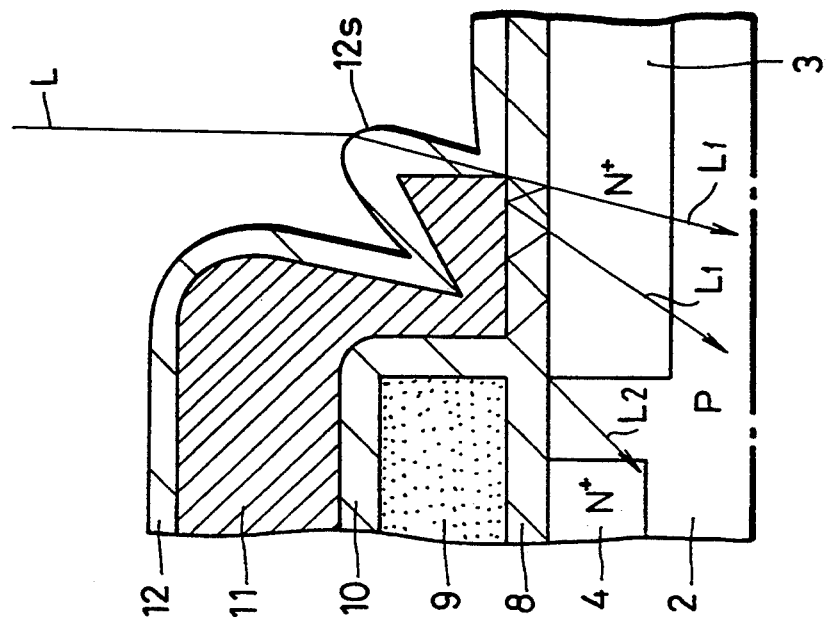

In the CCD solid state imaging device according to the comparative example, as shown in FIG. 5A, similarly to the case that the thickness of the surface protecting layer 12 is relatively thick (see FIG. 4A), the shape of the surface protecting layer 12 on the peripheral edge of the light sensing region 3 becomes the convex lens shape (12s) whose curvature is small. The oblique light component $L_1$ traveling toward the vertical register 4 and the reflected light component $L_2$ that reaches the vertical register 4 while being reflected between the silicon surface and the under surface of the Al light-intercepting layer 11 are increased. Thus, also in this case, the smear occurs frequently.

In the embodiments 1 and 2, as shown in FIGS. 4B and 4C, the thickness of the surface protecting layer 12 is thin so that, regardless of the amount in which the Al light-intercepting layer 11 is etched away by the isotropic-etching process, the curvatures of the convex lens shapes 12as and 12a of the surface protecting layer 12 formed on the peripheral edge of the light sensing region 3 are substantially the same. Both of them become convex lens shapes having large curvatures. Accordingly, when the thickness of the surface protecting layer 12 is very thin, the oblique light component $L_1$ and the reflected light component $L_2$ are reduced with respect to the embodiments 1 and 2, thereby the smear being reduced.

The surface protecting layer 12 cannot be reduced too much in thickness due to a restriction on the spectral characteristic and from a passivation function standpoint. Therefore, it is important that the isotropic-etching against the Al light-intercepting layer 11 is determined considering the whole film thickness of the Al light-intercepting layer 11, the film thickness of the succeeding surface protecting layer 12 and the shape of the tapered portion 12a of the Al light-intercepting layer 11 formed on the peripheral edge of the light sensing region 3 as described above.

As described above, according to this embodiment, since the Al light-intercepting layer 11 is formed at its portion on the peripheral edge portion of the light sensing region 3 as the tapered portion 11a, the protecting surface layer 12 formed thereon has a satisfactory coverage and the surface protecting layer 12 on the peripheral edge of the light sensing region 3 become the convex shape 12a having the large curvature.

Accordingly, even when the light L incident from above is introduced into the edge portion of the light sensing region 3, i.e., the portion 12a of the surface protecting layer 12 formed as the convex lens shape, the light L is refracted by a small amount because the curvature of that portion 12a is large. Consequently, the oblique light component $L_1$ obliquely introduced into the vertical register 4 and the reflected light component $L_2$ introduced into the vertical register 4 while being reflected between the substrate 1 and the Al light-intercepting layer 11 are reduced. Hence, the occurrence of smear can be reduced.

According to the manufacturing method of this embodiment, after the Al light-intercepting layer 11 was etched away by the isotropic-etching process by using the photoresist layer 15 having the hole 15a formed at its portion corresponding to the light sensing region 3 as the mask, the Al light-intercepting layer 11 is etched away by the anisotropic-etching process by using the photoresist layer 15 as the mask to form the light sensing region hole 14. Thereafter, the surface protecting layer 12 is formed on the whole surface. Therefore, by the isotropic etching process, the side etching of the Al light-intercepting layer 11 proceeds under the photoresist layer 15, in particular, over a range slightly wider than the width of the hole 15a. Thus, when the light sensing region hole 14 is formed by the succeeding anisotropic etching process, of the Al light-intercepting layer 11, the portion on the peripheral edge on the light sensing region 3 is formed as the tapered portion 11a whose slope is descended toward the light sensing region 3. That is, by using the manufacturing method of this embodiment, the aforesaid tapered portion 11a can be formed on the Al light-intercepting layer 11 on the peripheral edge of the light sensing region 3 with ease.

Further, according to the manufacturing method of the present invention, although the number of processes is increased with the isotropic-etching as compared with that of the prior art, the smear can be prevented from being produced as the surface protecting layer 12 is formed as described above. That is, the smear can be reduced while the number of processes is suppressed to the minimum.

In particular, according to this embodiment, since the isotropic etching and the anisotropic etching are carried out by using the same photoresist layer 15 as the mask, it is sufficient to effect the patterning on the photoresist layer 15 only once. Further, since the tapered portion 11a of the Al light-intercepting layer 11 is formed in a self-alignment fashion due to the side etching based on the isotropic-etching, the shapes of the tapered portion 11a can be formed substantially uniformly. In addition, the final shape of the light sensing hole 14 can be formed uniformly by the RIE process with high accuracy.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid state imaging device comprising:
   a semiconductor substrate;
   a light sensing region formed on said semiconductor substrate;
   a transfer means formed on said semiconductor substrate and formed adjacent to said light sensing region;
   a light intercepting means for shielding said transfer means from incident light having an edge which has a narrow portion on said light sensing region and which has an edge which sticks out toward said light sensing region and wherein said edge is tapered so that its end has a slope that extends downwardly toward said light sensing region, and
   a passivation layer covering said transfer means and said light sensing region.

2. The solid state imaging device according to claim 1, wherein said transfer means comprises a transfer region formed on said semiconductor substrate and a transfer electrode arranged on said transfer region through an insulating layer.

3. The solid state imaging device according to claim 1, wherein said light intercepting means covers the side portion of said transfer means.

4. The solid state imaging device according to claim 1, wherein said passivation layer is formed of either a silicon nitride or silicon oxide.

5. The solid state imaging device according to claim 1, wherein said light intercepting means consists of an aluminum layer.

* * * * *